United States Patent
Matsumoto et al.

(10) Patent No.: US 6,844,549 B2
(45) Date of Patent: Jan. 18, 2005

(54) ELECTRON BEAM LENGTH-MEASUREMENT APPARATUS AND MEASUREMENT METHOD

(75) Inventors: Jun Matsumoto, Tokyo (JP); Takayuki Nakamura, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 10/274,328

(22) Filed: Oct. 18, 2002

(65) Prior Publication Data

US 2003/0052270 A1 Mar. 20, 2003

Related U.S. Application Data

(63) Continuation of application No. PCT/JP01/03534, filed on Apr. 24, 2001.

(30) Foreign Application Priority Data

Apr. 25, 2000 (JP) ........................................ 2000-123921

(51) Int. Cl.[7] ............................................. H01J 37/244
(52) U.S. Cl. ........................................................ 250/310
(58) Field of Search .......................................... 250/310

(56) References Cited

U.S. PATENT DOCUMENTS 4,741,669 A    5/1988   Shimokawabe 6,476,388 B1 * 11/2002  Nakagaki et al. ........... 250/310
6,538,249 B1 *  3/2003  Takane et al. ............... 250/310

FOREIGN PATENT DOCUMENTS

| JP | 04-038412 | 2/1992 |
|----|-----------|--------|
| JP | 07-243835 | 9/1995 |
| JP | 11-149895 | 6/1999 |

* cited by examiner

*Primary Examiner*—Kiet T. Nguyen
(74) *Attorney, Agent, or Firm*—Morrison & Foerster LLP

(57) ABSTRACT

An electron beam length-measurement apparatus for measuring a length of a predetermined portion of an object by using an electron beam, includes: an electron gun for emitting the electron beam; a deflecting unit for deflecting the electron beam; an object holding unit on which the object is to be placed; a detector for detecting electrons that are scattered by the electron beam; a memory for storing layout position information that specifies a layout position at which the predetermined portion of the object; a length-measurement scanning controller for controlling the deflecting unit to scan with the electron beam to allow the layout position on the object to be irradiated with the electron beam; and a measurement unit operable to measure the length of the predetermined portion of the object based on a changing manner of the electrons successively detected by the detector while the length-measurement scanning controller scans with the electron beam.

10 Claims, 4 Drawing Sheets

FINE ALIGNMENT AND LENGTH MEASUREMENT

FOCUS ANALYSIS

FINE ALIGNMENT AND LENGTH MEASUREMENT

3 LINES × 64 TIMES

FOCUS ANALYSIS

64 TIMES × 4 PLANES

ELECTRON BEAM LENGTH-MEASUREMENT APPARATUS AND MEASUREMENT METHOD

CROSS-REFERENCE TO RELATED APPLICATIONS

This application is a continuation of co-pending International Application No. PCT/JP01/03534 filed on Apr. 24, 2001 and published under PCT Article 21(2) on Nov. 1, 2001 as International Publication No. WO 01/81863. The international application PCT/JP01/03534 claims priority based on a Japanese patent application, 2000-123921 filed on Apr. 25, 2000, the contents of which are incorporated herein by reference.

BACKGROUND OF THE INVENTION

1. Field of the Invention

The present invention relates to an electron beam length-measurement apparatus and a measurement method for measuring a length of a predetermined portion in an object by using an electron beam.

2. Description of the Related Art

An optical length-measurement apparatus has been conventionally known that obtains an image of an object for which a length-measurement is to be performed by means of an optical microscope and measures a length of a predetermined portion in the object to be measured. In the electron length-measurement apparatus, the length measurement is performed for a GMR (Giant Magneto Resistive) head device as the object in some cases.

FIG. 1 schematically shows a structure of an exemplary GMR head device. The GMR head device includes a writing magnetic pole 200 for recording information onto a magnetic recording medium, a reading sensor 206 for reading information recorded onto the recording information medium, an upper shield layer 202 and a lower shield layer 204. In a case of the length measurement for the GMR head device, a width of the writing magnetic pole 200, a width of the reading sensor 206, and a length related to a relative position between the writing magnetic pole 200 and the reading sensor 206 is measured.

In recent years, a pattern in the GMR head device, such as a magnetic pole pattern, has become finer and therefore the length-measurement by the optical length-measurement apparatus has become difficult. Thus, an electron beam length-measurement apparatus that performs the length-measurement by using an electron beam has attracted attention.

FIGS. 2A and 2B are diagrams explaining a fine alignment, the length measurement and a focus analysis in the conventional electron beam length-measurement apparatus. Please note that the term "fine alignment" means an adjustment for realizing appropriate irradiation of the object to be measured with the electron beam in the present application.

In the conventional electron beam length-measurement apparatus, each of a plurality of positions (525 lines in FIG. 2A) determined in advance on the object to be measured is scanned with the electron beam a plurality of times (64 times in FIG. 2A), as shown in FIG. 2A. The fine alignment or the length measurement for a predetermined portion of the object is performed based on an image formed by secondary electrons detected by the above scanning and/or a manner, so-called a "line profiling", in which the secondary electron amount and the backscattered electron amount detected during the scanning with the electron beam of each of the predetermined positions is changed.

In addition, as shown in FIG. 2B, in the conventional electron beam length-measurement apparatus, the focus position adjustment for the object is performed a plurality of times (4 times in FIG. 2B). Then, at each of the plurality of positions to which the focus position is adjusted, scanning with the electron beam is performed for a plurality of positions (525 lines in FIG. 2B) determined in advance for a plurality of times (64 times in FIG. 2B). The focus analysis is then performed based on contrast of the secondary electron image detected at each of the focus positions.

The electron beam length-measurement apparatus is required to measure the length of the predetermined portion of the object to be measured with high accuracy at high speed. Moreover, when the object to be measured is irradiated with the electron beam, the object may be contaminated. Thus, it is necessary to prevent contamination on the object to be measured.

SUMMARY OF THE INVENTION

Therefore, it is an object of the present invention to provide an electron beam length-measurement apparatus and a measurement method, which are capable of overcoming the above drawbacks accompanying the conventional art. The above and other objects can be achieved by combinations described in the independent claims. The dependent claims define further advantageous and exemplary combinations of the present invention.

According to the first aspect of the invention, an electron beam length-measurement apparatus for measuring a length of a predetermined portion of an object to be measured by using an electron beam, comprises: an electron gun operable to emit the electron beam; a deflecting unit operable to deflect the electron beam; an object holding unit to place the object to be measured thereon; a detector operable to detect electrons that are scattered by the electron beam; a memory operable to store, in advance, layout position information that specifies a layout position of the predetermined portion to be measured in the object; a length-measurement scanning controller operable to control the deflecting unit to scan with the electron beam to allow the layout position on the object to be irradiated with the electron beam; and a measurement unit operable to measure the length of the predetermined portion on the object, based on a changing manner of the electrons successively detected by the detector while the length-measurement scanning controller scans the object with the electron beam.

According to the second aspect of the invention, an electron beam length-measurement apparatus for measuring a length of a portion of an object to be measured by using an electron beam, comprises: an electron gun operable to emit the electron beam; a deflecting unit operable to deflect the electron beam; an object holding unit to place the object thereon; a detector operable to detect electrons that are scattered by the electron beam; a memory operable to store layout position information that specifies a layout position of a predetermined portion in the object; an alignment scanning controller operable to control the deflecting unit to scans with the electron beam to allow at least two points in the layout position to be irradiated with the electron beam; an alignment unit operable to adjust the scanning on the object such that the deflecting unit scan with the electron beam, based on a changing manner of the electrons detected by the detector, during the scanning on the object with the electron beam by the alignment scanning controller; a length-measurement scanning controller operable to control the deflecting unit to scans with the electron beam, based on the scanning being adjusted by the alignment unit, to allow the portion to be measured to be irradiated with the electron beam; and a measurement unit operable to measure the length of the portion of the object to be measured, based on a changing manner of the electrons successively detected by the detector while the length-measurement scanning controller scans with the electron beam.

In the electron beam length-measurement apparatus, the memory may sore a linear portion arranged on a line in the predetermined portion, as the layout position information, the alignment scanning controller may scan the object with the electron beam such that the linear portion is irradiated with the electron beam at two or more points substantially perpendicularly to the linear portion, based on the layout position information stored in the memory, the alignment unit may adjust the deflecting unit to allow the electron beam to scan substantially parallel to the linear portions, and the length-measurement scanning controller may scan with the electron beam so as to allow the portion to be measured to be irradiated with the electron beam by the deflecting unit after being adjusted.

In the electron beam length-measurement apparatus, the memory may store, as the layout position information, a relative position between the linear portion and the portion to be measured in a direction substantially perpendicular to the linear portion, and the length-measurement scanning controller may scan with the electron beam, based on the layout position information.

According to the third aspect of the invention, an electron beam length-measurement apparatus for measuring a length of a portion on an object to be measured by using an electron beam, comprises: an electron gun operable to emit the electron beam; an electron lens operable to converge the electron beam onto a predetermined focus; a deflecting unit operable to deflect the electron beam; an object holding unit to place the object to be measured thereon; a detector operable to detect electrons that are scattered by the electron beam; a memory operable to store layout position information that specifies a layout position of a predetermined portion of the object; a focus-detection scanning controller operable to control the deflecting unit to scans with the electron beam, based on the layout position information; a focusing controller operable to change a relative position between the object and the focus of the electron lens, and to bring the object into the focus of the electron lens at each relative position that has been changed based on a changing manner of the electrons successively detected by the detector while the focus-detection scanning controller scans with the electron beam; a length-measurement scanning controller operable to scan the object to allow the portion to be measured to be irradiated with the electron beam, after the object has been brought into the focus of the electron lens; and a measurement unit operable to measure the length of the portion to be measured, based on a changing manner of the electrons successively detected by the detector while the length-measurement scanning controller scans with the electron beam.

In the electron beam length-measurement apparatus, the object holding unit may hold the object movably, and the focusing controller may move the object holding unit in a direction parallel to an optical axis of the electron lens to bring the object into the focus of the electron lens.

In the electron beam length-measurement apparatus, the focus of the electron lens maybe adjustable, and the focusing controller may move the focus of the electron lens to bring the object into the focus of the electron beam.

According to the fourth aspect of the invention, a measurement method for measuring a length of a predetermined portion of an object to be measured by using an electron beam, comprises: storing, in advance, layout position information for specifying a layout position of the predetermined portion in the object; scanning the object with the electron beam, based on the layout position information, to allow the layout position to be irradiated with the electron beam; and measuring the length of the predetermined portion, based on a changing manner of electrons successively detected during scanning with the electron beam in the length-measurement scanning step.

According to the fifth aspect of the invention, a measurement method for measuring a length of a portion of an object to be measured by using an electron beam, comprises: scanning the object with the electron beam for an alignment, based on layout position information for specifying a layout position of a predetermined portion in the object, to allow at least two points in the layout position to be irradiated with the electron beam; adjusting the scanning of the electron beam, based on a changing manner of electrons detected during the scanning in the alignment scanning step; scanning with the electron beam, based on the scanning adjusted in the alignment adjusting step, to allow the portion to be measured to be irradiated with the electron beam so as to measure the length of the portion to be measured; and measuring the length of the portion to be measured, based on the changing manner of the electrons successively detected during the scanning in the length-measurement scanning step.

According to the sixth aspect of the invention, a measurement method for measuring a length of a portion of an object to be measured by using an electron beam, comprises: changing a relative position of one of the object and a focus of an electron lens with respect to the other, and for scanning with the electron beam for each value of the relative position, based on layout position information regarding a layout position of a predetermined position in the object; bringing the object into the focus of the electron lens, based on a changing manner of electrons successively detected during the scanning in the focus-detection scanning step; scanning with the electron beam to allow the portion to be measured to be irradiated with the electron beam, after bringing the object into the focus of the electron lens; and measuring the length of the portion to be measured, based on the changing manner of the electrons successively detected during the scanning in the length-measurement scanning step.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
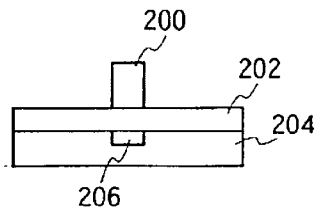
FIG. 1 schematically shows a structure of a GMR head device.
Figure 2A:
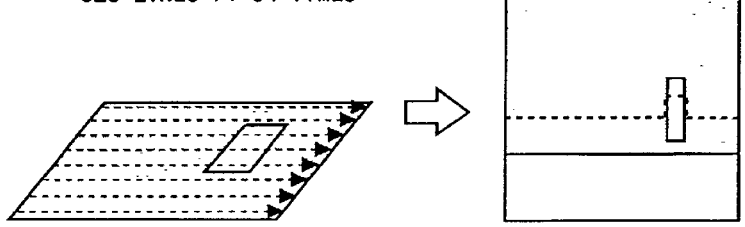
FIGS. 2A and 2B illustrate a fine alignment, a length measurement and a focus analysis in a conventional electron beam length-measurement apparatus.
Figure 2B:
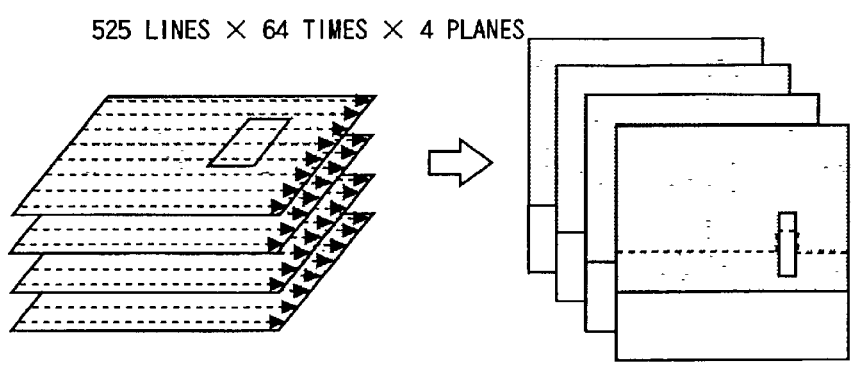
Figure 3:
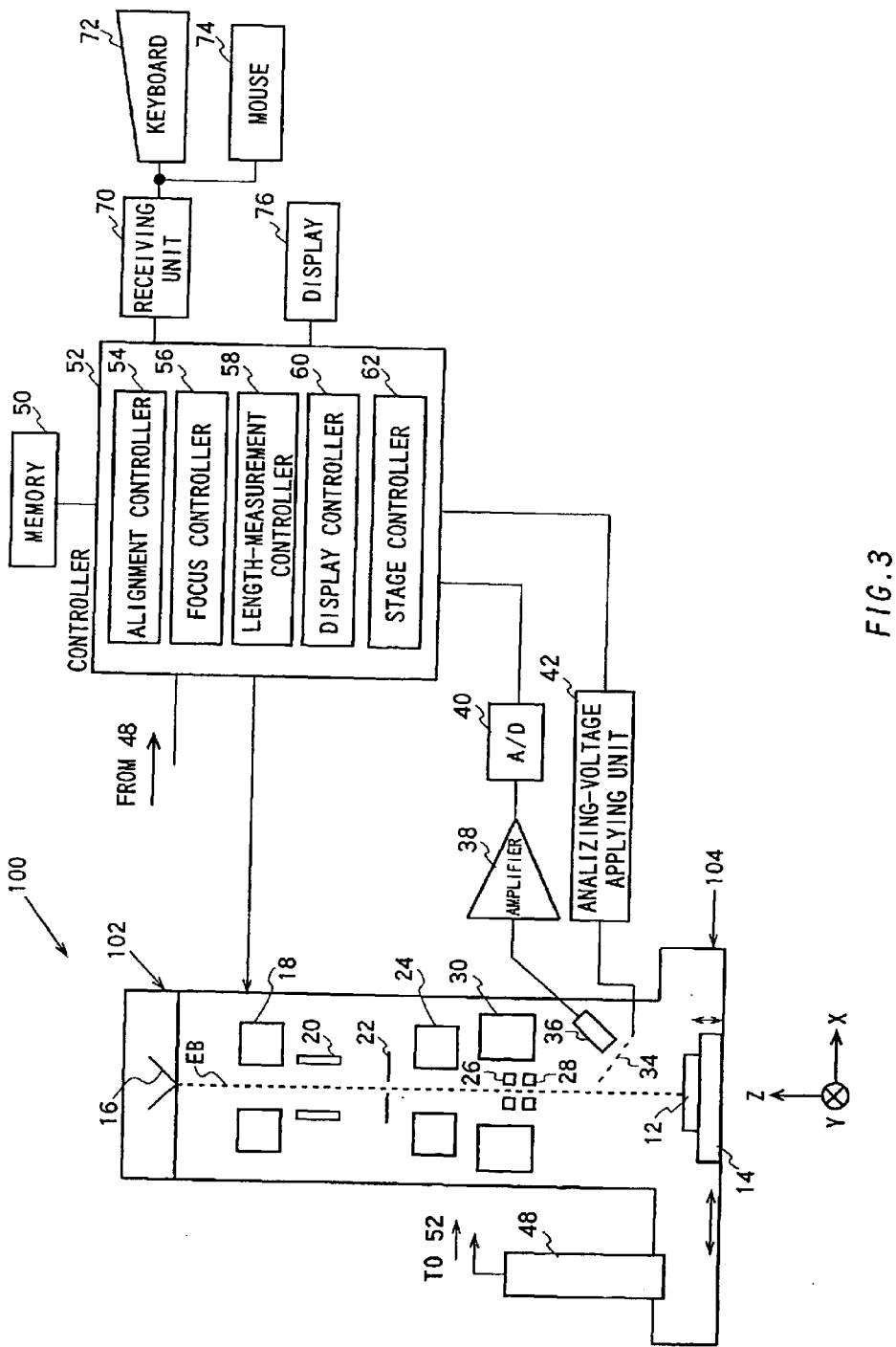
FIG. 3 shows a structure of an electron beam length-measurement apparatus according to an embodiment of the present invention.

FIG. 3 schematically shows a structure of an electron beam length-measurement apparatus according to an embodiment of the present invention. The electron beam length-measurement apparatus of the present embodiment measures a length of a predetermined portion of a GMR head device that is an example of an object to be measured in length. In the following description, X-, Y- and Z-axes are defined as shown in FIG. 3.

The object may be a semiconductor device composed of active devices such as ICs (Integrated Circuits) or LSIs (Large-Scale Integrated Circuits), or other devices such as a passive device or various types of sensors. Also, the object may be a device in which the above-mentioned devices are housed in a single package or a device such as a breadboard having a predetermined function by being provided with the above-mentioned devices mounted on a printed board. Moreover, the object maybe a device that may tend to be damaged by a magnetic field, such as the GMR head device.

The electron beam length-measurement apparatus 100 includes an electron beam lens barrel 102, a vacuum chamber 104, an amplifier 38, an analog-to-digital converter (A/D converter) 40, a memory 50, a controller 52, an analyzing-voltage applying unit 42, a receiving unit 70, a keyboard 72, a mouse 74 and a display 76. The electron beam lens barrel 102 includes an electron gun 16, an electron lens 18, deflecting plates 20, a chopping aperture 22, an electron lens 24, a deflector 26 as an exemplary deflecting unit, an astigmatism correcting lens 28, an objective lens 30, an energy filter 34, and a detector 36. Each of the electron lens 18, the deflecting plates 20, the electron lens 24, the deflector 26, the astigmatism correcting lens 28 and the objective lens 30 may use either magnetic field or electric field. In the present embodiment, it is preferable that these elements use the electric field since the object to be measured is the device that may be damaged by the magnetic field, such as the GMR device.

The vacuum chamber 104 includes a stage 14 as an exemplary object holding unit and an optical microscope 48. The stage 14 holds the object 12 in such a manner that the object 12 is attachable and removable. The stage 14 is arranged to be movable in the vacuum chamber 104 in directions along the X-, Y- and Z-axes. In the present embodiment, the stage 14 holds a sample substrate having a plurality of objects 12 to be measured in a removable manner. Please note that the sample substrate is a so-called bar having a plurality of objects 12 to be measured that was sliced from a wafer on which a plurality of objects 12 are formed. The optical microscope 48 captures an image in a field of view thereof and inputs the captured image to the controller 52. In the present embodiment, the optical microscope 48 captures an image of the object 12 placed on the stage 14 located in the field of view when the global alignment is performed, and inputs the captured image to the controller 52.

In the electron beam length-measurement apparatus, the electron gun 16 emits an electron beam EB. The electron beam EB is then subjected to a predetermined adjustment by the electron lens 18 and is shaped to have a predetermined shape by the opening of the chopping aperture 22.

The deflector 26 deflects the shaped electron beam EB to change the position where the electron beam EB reaches. The astigmatism correcting lens 28 corrects astigmatism occurring in the electron beam EB. Secondary electrons generated by irradiation of the object 12 with the electron beam are successively detected by the detector 36 via the energy filer 34. The detector 36 inputs the detected amount of the secondary electrons to the amplifier 38.

The amplifier 38 inputs the amount of the secondary electrons input from the detector 36 to the A/D converter 40 after amplifying it. The A/D converter 40 converts the secondary electron amount input from the amplifier 38 into a digital signal, and inputs the digital signal to the controller 52. The analyzing-voltage applying unit 42 applies an analyzing voltage to the energy filter 34 in accordance with a control by the controller 52.

The memory 50 stores a relationship between a time period and a length of the scanning with the electron beam, for example, at least one factor used in calculation for obtaining the length from the scanning time period. The memory 50 also stores layout position information that specifies a layout position of a portion in the object 12. In the present embodiment, the memory 50 stores the layout position information that specifies the layout positions of a writing magnetic pole, a reading sensor, an upper shield layer and a lower shield layer formed in the object 12. More specifically, the memory 50 stores the width of the writing magnetic pole, the width of the reading sensor, a relative position between the writing magnetic pole and the reading sensor, a relative position between the lower shield layer and the writing magnetic pole in a direction perpendicular to the lower shield layer, and the like.

The controller 52 includes an alignment controller 54 as an exemplary alignment scanning controller and an exemplary alignment unit, a focus controller 56 as an exemplary focus-detection scanning controller and an exemplary focusing controller, a length-measurement controller 58 as an exemplary length-measurement scan controller and an exemplary measurement unit, a display controller 60 and a stage controller 62. The alignment controller 54 adjusts the global alignment, so as to move the object 12 to be measured to a position in a region that can be irradiated with the electron beam from the electron gun 16, based on the image input from the optical microscope 48. In the present embodiment, the adjustment is for fitting the position of each object 12 in the bar into the coordinate system of the stage 14.

After the focus adjustment for the electron lenses 18, 24 and 30, the alignment controller 54 performs a local alignment (fine alignment). That is, the alignment controller 54 scans with the electron beam in such a manner that at least two points in the layout position at which a predetermined portion is to be positioned are irradiated with the electron beam, based on the layout position information. In the present embodiment, the alignment controller 54 irradiates two positions in the lower shield layer as an example of a linear portion arranged to form a line together therewith in the object 12 with the electron beam substantially perpendicularly.

The alignment controller 54 detects displacement amounts in the X-axis direction and the Y-axis direction with respect to predetermined references, the rotation amount and the like based on a changing manner in which the secondary electrons detected by the detector 36. The alignment controller 54 also adjust in various types for the condition of scanning with the electron beam such as the adjustment of the scanning direction and the adjustment of the scanning position based on the detected amounts. In the present embodiment, the alignment controller 54 detects two points in the lower shield layer based on the changing manner of the secondary electrons detected by the detector 36 when the two points are irradiated with the electron beam, and adjusts the deflection by the deflector 26 so as to make the scanning direction of the electron beam be parallel to a line connecting these two points.

The focus controller 56 makes the stage controller 62 move the object 12 to a position onto which the electron beam can be cast. The focus controller 56 changes the relative position of the object 12 with respect to the focus position of the electron lens system including the lenses 18, 24, and 30 by changing the height of the stage 14 by means of the stage controller 62. Moreover, the focus controller 58 detects the changing manner of the secondary electrons successively detected by the detector 36 during scanning with the electron beam based on the layout position information at each of the heights of the stage 14. In the present embodiment, the focus controller 56 scans with the electron lens in such a manner that one or more points of the writing magnetic pole, the lower shield layer or the like are irradiated with the electron beam based on the layout position information. It is preferable to cast the electron beam onto a portion having a relatively longer length based on the layout position since that portion can be irradiated with the electron beam in most cases.

The focus controller 56 detects a position of the object 12 to be measured on the Z-axis, based on a plurality of changing manners of the electrons successively detected, in a case where the electron lens system including lenses 18, 24 and 30 is in focus on the object 12. In the present embodiment, the focus controller 56 detects a position of the object 12 in a case where one of the changing manners of the secondary electron amount that has the sharpest rate of increase of the secondary electron amount is detected, as an in-focus position where the electron lens system including lenses 18, 24, and 30 is in focus. The focus controller 56 also controls the stage controller 62 to adjust the height of the object 12 in the Z-axis direction so as to bring the object 12 into the focus of the electron lens system including lenses 18, 24 and 30.

After the local alignment has been finished, the length-measurement controller 58 controls the deflector 26 to scanns with the electron beam for at least one of the layout positions of the object 12 that is to include the portion for which the length is to be measured and an area in the vicinity of the layout position based on the layout position information. In the present embodiment, the length-measurement controller 58 controls scanning with the electron beam in such a manner that a position displaced from the line connecting the two points in the lower shield layer, that has been detected in the local alignment, by the relative position of the writing magnetic pole with respect to the lower shield layer in the direction perpendicular to the lower shield layer, the relative position being stored in the memory 50. Thus, the writing magnetic pole can be irradiated with the electron beam appropriately.

The length-measurement controller 58 detects a time period for irradiating the electron beam on a predetermined portion of the object 12 to be measured in length, based on the changing manner of the electrons successively detected by the detector 36 during scanning with the electron beam. The length-measurement controller 58 then detects a length corresponding to the detected time period based on the relationship stored in the memory 50. Thus, the width of the writing magnetic pole in a direction parallel to the lower shield layer can be measured.

The display controller 60 controls the display 76 to display the length of the predetermined portion of the object 12 that has been detected by the length-measurement controller 58. The stage controller 62 moves the stage 14 in the X-Y plane. For example, the stage controller 62 moves the stage 14 so that the object 12 to be measured placed on the stage 14 is positioned within the field of view of the optical microscope 48. Moreover, the stage controller 62 moves the stage 14 to allow the object 12 to be irradiated with the electron beam. Furthermore, the stage controller 62 moves the stage 14 in the Z-axis direction. The receiving unit 70 receives a user's instruction from the keyboard 72 and the mouse 74.

Figure 4:
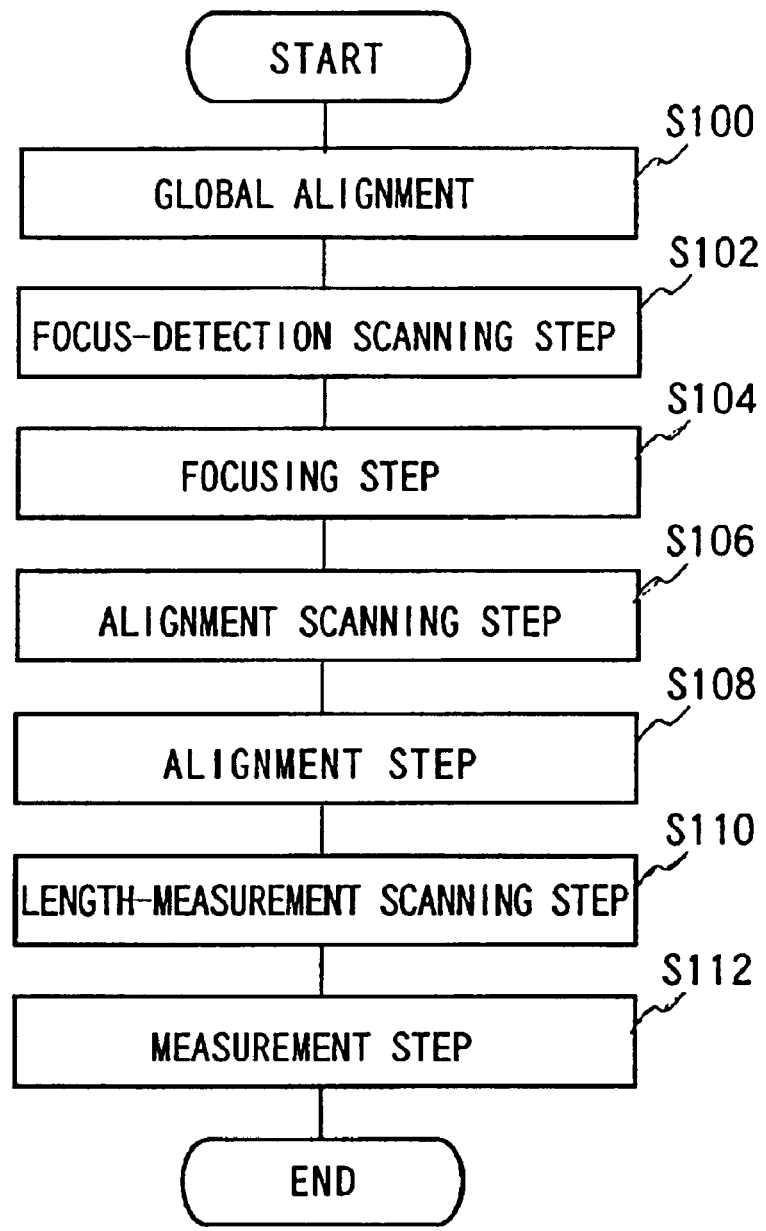
FIG. 4 is a flowchart showing operations of the electron beam length-measurement apparatus according to the embodiment of the present invention.

FIG. 4 is a flowchart explaining operations of the electron beam length-measurement apparatus according to the embodiment of the present invention. In the electron beam length-measurement apparatus, the stage controller 62 moves the stage 14 in such a manner that the object 12 placed on the stage 14 is positioned in the field of view of the optical microscope 48. Then, the optical microscope 48 captures an image of the object 12 in the field of view and inputs the captured image to the controller 52. The alignment controller 54 performs the global alignment based on the image of the object 12 input from the optical microscope 48 in such a manner that the object 12 to be measured can be moved to a position with in a region that can be irradiated with the electron beam from the electron gun 16 (Step S100).

Next, the focus controller 56 controls the stage controller 62 to move the object 12 to a position that can be irradiated with the electron beam, and changes the relative position of the object 12 with respect to the focus of the electron lens system including the lenses 18, 24, and 30 by changing the height of the stage 14 by means of the stage controller 62. Also, the focus controller 58 scans with the electron beam, based on the layout position information at each of the heights of the stage 14, in such a manner that one or more points in the writing magnetic pole, and the lower shield layer or the like are irradiated with the electron beam (Step S102).

The focus controller 56 then detects the position of the object 12 in the Z-axis direction while the electric lens system including the lenses 18, 24 and 30 is in focus on the object 12 based on the changing manners of the electrons successively detected, and controls the stage controller 62 to adjust the height of the object 12 in the Z-axis direction to the thus detected position (Step S104).

Next, the alignment controller 54 scans with the electron beam for two points substantially perpendicular to of the lower shield layer, that is an exemplary linear portion in the object 12 based on the layout position information (Step S106). Based on the changing manners of the secondary electrons detected by the detector 36 during the irradiation of the two points with the electron beam, the alignment controller 54 detects the two points of the lower shield layer, and adjusts the deflection by the deflector 26 to make the scanning direction of the electron beam be parallel to the line connecting the two points (Step S108).

Then, the length-measurement controller 58 scans with the electron beam so as to cast the electron beam onto a position displaced from the line connecting the aforementioned two points in the lower shield layer detected in the local alignment, up to the relative position of the wiring magnetic pole with respect to the lower shield layer in a direction perpendicular to the lower shield layer (Step S110). Also, the length-measurement controller 58 also detects a time period for irradiating the electron beam on the writing magnetic pole of the object 12, based on the changing manner of the electrons successively detected by the detector 36, and detects a length corresponding to the thus detected time period based on the relationship stored in the memory 15 (Step S112).

Figure 5A:
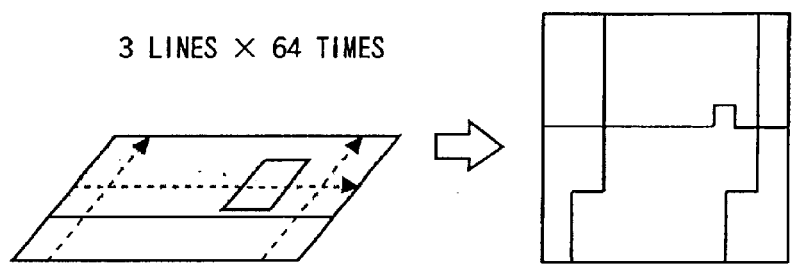
FIGS. 5A and 5B illustrate the fine alignment, the length measurement and the focus analysis in the electron beam length measurement apparatus according to the embodiment of the present invention.
Figure 5B:
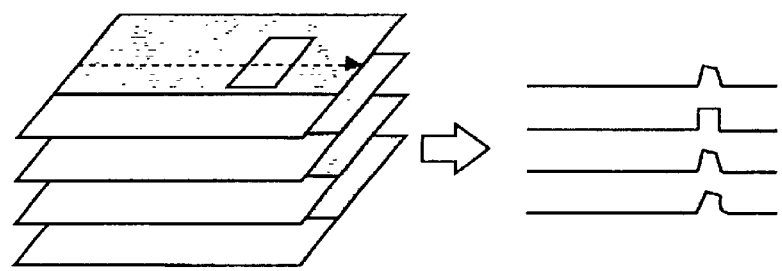

FIGS. 5A and 5B illustrate the fine alignment, the length-measurement and the focus analysis in the electron beam length-measurement apparatus according to the embodiment of the present invention. In the electron beam length-measurement apparatus of the present embodiment, in a case of the fine alignment and the length-measurement, as shown in FIG. 5A, a length of a predetermined portion can be detected by scanning three positions with the electron beam, for example. Thus, as compared to the irradiation amount of the electron beam in the conventional electron beam length-measurement apparatus, the amount of the electron beam with which the object 12 to be measured is irradiated can be reduced, thereby preventing contamination of the object 12. In addition, the time period for the length measurement can be reduced.

Moreover, according to the electron beam length-measurement apparatus of the present embodiment, in a case of the focus analysis, the focus of the electron lens system including the lenses 18, 24, and 30 can coincide with the position of the object 12 by scanning a single point in a predetermined portion of the object 12 with the electron beam for each of different focus positions of the electron lens system including the lenses 18, 24 and 30. Therefore, the amount of the electron beam with which the object 12 is irradiated can be reduced as compared to the irradiation amount in the conventional electron beam length-measurement apparatus. Furthermore, the time period for the focus analysis can be reduced.

The present invention cannot be limited to the above embodiment but can be modified in various ways. For example, the relative position of the object 12 to be measured with respect to the focus position of the electron lens system including the lenses 18, 24 and 30 is adjusted by moving the stage 14 in the Z-axis direction in the above embodiment. However, the present invention is not limited thereto. The relative position of the object 12 with respect to the focus position of the electron lens system including the lenses 18, 24 and 30 may be adjusted by adjusting the lens properties of the lenses 18, 24 and 30 of the electron lens system. Moreover, in the above embodiment the direction of the length-measurement by the electron beam is adjusted by scanning the object 12 with the electron beam substantially parallel to each other so that the electron beam passes through the two points in the linear portions on the object 12. However, the object 12 may be scanned with the electron beam in such a manner that the electron beam passes through two positions in a predetermined portion of the object 12.

In addition, the secondary electrons generated by the irradiation of the object 12 with the electron beam are detected by the detector 36 and the changing manner of the secondary electron amount is used. However, the present invention is not limited thereto. For example, the detector 36 may be arranged to detect backscattered electrons scattered from the object 12 by the electron beam so as to allow the length measurement, the alignment and the focus adjustment to be performed based on the changing manner of the backscattered electron amount. That is, any detector can be used as long as the electron beam length-measurement apparatus is arranged to scatter electrons by the electron beam and the detector detects the scattered electrons so as to allow the length measurement, the alignment and the focus adjustment to be performed based on the changing manner of the electron amount.

As is apparent from the above, according to the present invention, it is possible to appropriately prevent the object to be measured from being contaminated. Moreover, according to the present invention, it is possible to reduce a time period required for the operations.

Although the present invention has been described by way of exemplary embodiments, it should be understood that those skilled in the art might make many changes and substitutions without departing from the spirit and the scope of the present invention which is defined only by the appended claims.

What is claimed is:

1. An electron beam length-measurement apparatus for measuring a length of a predetermined portion of an object to be measured by using an electron beam, comprising:

an electron gun operable to emit the electron beam;

a deflecting unit operable to deflect the electron beam;

an object holding unit to place the object thereon;

a detector operable to detect electrons that are scattered by the electron beam;

a memory operable to store, in advance, layout position information that specifies a layout position of the predetermined portion to be measured;

an alignment scanning controller for controlling said deflecting unit to scan the object twice with the electron beam in one dimension of the object, obtaining a point at which the amount of electrons, successively detected by the detector, change for each scan, obtaining a line by connecting said obtained two points, and determining an alignment of the object upon comparing said obtained line with said layout position information;

a length-measurement scanning controller operable to control said deflecting unit to scan the object once with the electron beam to allow the layout position of the predetermined portion to be irradiated with the electron beam, based on the layout position information; and a measurement unit operable to measure the length of the predetermined portion, based on a changing amount of the electrons successively detected by said detector while said length-measurement scanning controller scans the object.

2. An electron beam length-measurement apparatus as claimed in claim 1 further comprising:

an alignment unit operable to adjust scanning on the object by said deflecting unit based on a changing amount of the electrons detected by the detector, during scanning controlled by said alignment scanning controller; and wherein the length-measurement scanning controller controls said deflecting unit based on the scanning being adjusted by said alignment unit.

3. An electron beam length-measurement apparatus as claimed in claim 2, wherein said memory stores a linear portion arranged on a line in the predetermined portion, as the layout position information, said alignment scanning controller scans the object twice with the electron beam such that the linear portion is irradiated at two or more points substantially perpendicular to the linear portion, based on the layout position information stored in said memory, said alignment unit adjusts said deflecting unit to allow scanning substantially parallel to the linear portion, and said length-measurement scanning controller scans with the electron beam so as to allow the portion to be measured to be irradiated with said electron beam by said deflecting unit after being adjusted.

4. An electron beam length-measurement apparatus as claimed in claim 3, wherein said memory stores, as the layout position information, a relative position between the linear portion and the predetermined portion to be measured in a direction substantially perpendicular to the linear portion, and said length-measurement scanning controller scans with the electron beam, based on the layout position information.

5. An electron beam length-measurement apparatus for measuring a length of a portion on an object to be measured by using an electron beam, comprising:

an electron gun operable to emit the electron beam;

an electron lens operable to converge the electron beam onto a predetermined focus;

a deflecting unit operable to deflect the electron beam;

an object holding unit to place the object to be measured thereon;

a detector operable to detect electrons that are scattered by the electron beam;

a memory operable to store layout position information that specifies a layout position of a predetermined portion of the object;

a focus-detection scanning controller operable to control said deflecting unit to scan with the electron beam, based on the layout position information;

a focusing controller operable to change a relative position between the object and the focus of the electron lens, wherein said focusing controller sets a focused position based on an amount of electrons successively detected by said detector as said focus detection scanning controller scans with the electron beam at each relative position;

a length-measurement scanning controller operable to scan the object to allow the portion to be measured to be irradiated with the electron beam, after the object has been brought into focus based on the focused position; and a measurement unit operable to measure the length of the portion to be measured, based on a changing amount of the electrons successively detected by said detector while said length-measurement scanning controller scans with the electron beam.

6. An electron beam length-measurement apparatus as claimed in claim 5, wherein said object holding unit holds the object movably, and said focusing controller moves said object holding unit in a direction parallel to an optical axis of said electron lens to bring the object into the focus of the electron lens.

7. An electron beam length-measurement apparatus as claimed in claim 5, wherein the focus of the electron lens is adjustable, and said focusing controller moves the focus of said electron lens to bring the object into the focus of the electron beam.

8. A measurement method for measuring a length of a predetermined portion of an object to be measured by using an electron beam, comprising:

a step of storing, in advance, layout position information for specifying a layout position of the predetermined portion in the object;

a first step of scanning the object twice with the electron beam in one dimension of the object to obtain a point at which the amount of electrons change for each scan and obtaining a line by connecting said obtained two points to determine an alignment of the object by comparing said obtained line with said layout position information;

a second step of scanning the object once with the electron beam, based on the layout position information, to allow the layout position to be irradiated with the electron beam; and a step of measuring the length of the predetermined portion, based on a changing amount of electrons successively detected during scanning with the electron beam in said second scanning step.

9. A measurement method as claimed in claim 8 further comprising:

a step of adjusting scanning based on a changing amount of electrons detected during the first scanning step; and wherein said second step of scanning is adjusted based on said adjusting step, to allow the portion to be measured to be irradiated with the electron beam so as to measure the length of the portion to be measured.

10. A measurement method for measuring a length of a portion of an object to be measured by using an electron beam, comprising:

changing a relative position of one of said object and a focus of an electron lens with respect to the other for scanning the electron beam at each relative position, based on layout position information regarding a layout position of a predetermined position in the object;

bringing the object into the focus of the electron lens at a focused position, based on an amount of electrons successively detected during scanning at each relative position;

scanning with the electron beam to allow the portion to be measured to be irradiated with the electron beam, after bringing the object into the focus of the electron lens based on the focused position; and measuring the length of the portion to be measured, based on a changing amount of the electrons successively detected during the scanning in said scanning step.

* * * * *